United States Patent
Park et al.

(10) Patent No.: US 7,924,629 B2
(45) Date of Patent: Apr. 12, 2011

(54) THREE-DIMENSIONAL MEMORY DEVICE AND PROGRAMMING METHOD

(75) Inventors: Ki-Tae Park, Seongnam-si (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 119 days.

(21) Appl. No.: 12/343,632

(22) Filed: Dec. 24, 2008

(65) Prior Publication Data

US 2009/0168533 A1      Jul. 2, 2009

(30) Foreign Application Priority Data

Dec. 28, 2007   (KR) .......................... 10-2007-0140503

(51) Int. Cl.
    *G11C 16/04*     (2006.01)
    *G11C 16/06*     (2006.01)

(52) U.S. Cl. ......... 365/185.28; 365/185.02; 365/185.17; 365/185.19

(58) Field of Classification Search ......................... None
     See application file for complete search history.

(56) References Cited

U.S. PATENT DOCUMENTS

| 7,023,739 B2* | 4/2006 | Chen et al. ............... 365/185.28 |
| 7,233,522 B2 | 6/2007 | Chen et al. |
| 2005/0122780 A1* | 6/2005 | Chen et al. ............... 365/185.17 |
| 2007/0008776 A1* | 1/2007 | Scheuerlein ............ 365/185.17 |

FOREIGN PATENT DOCUMENTS

KR      1020070003818 A      1/2007

* cited by examiner

*Primary Examiner* — Huan Hoang
*Assistant Examiner* — James G Norman
(74) *Attorney, Agent, or Firm* — Volentine & Whitt, PLLC

(57) ABSTRACT

A programming method and a three-dimensional memory device are disclosed. The three-dimensional memory device includes a stacked plurality of layers, each layer having a memory array, and each memory array having a string of memory cells. The programming method includes, for each unselected string associated with an unselected layer in the plurality of layers, charging the channel of memory cells associated with unselected string with a shut-off voltage, and thereafter programming a selected string associated with a selected layer in the plurality of layers.

15 Claims, 9 Drawing Sheets

Fig. 3

1st Layer Selection

| | Layer | Program | Read | Erase |
|---|---|---|---|---|
| Selected WL | - | Vpgm | Vr | Ve (0.3V) |
| Unselected WL | - | Vpass | Vread | Floating |
| Selected BL | - | 0 (or 0.5V) | Vpc (1.0V) | Floating |
| Unselected BL | - | Vcc | 0V | Floating |
| SSL | 1st | Vcc | Vread | Floating |
| | 2nd, 3rd, ⋯ | 0V | 0V | Floating |
| GSL | 1st | 0V | Vread | Floating |
| | 2nd, 3rd, ⋯ | > Vcc | 0V | Floating |
| CSL | - | > Vcc | 0V | Floating |
| WELL | 1st | 0V | 0V | Vers (18V) |
| | 2nd, 3rd, ⋯ | 0V | 0V | Vers (18V) |

Fig. 7

1st Layer Selection

| Signal | | Layer | Program | Read | Erase |
|---|---|---|---|---|---|
| Selected WL | | – | Vpgm | Vr | Ve (0.3V) |
| Unselected WL | | – | Vpass | Vread | Floating |
| Selected BL | | – | 0V | Vpc | Floating |
| Unselected BL | | – | Vcc | 0V | Floating |
| SSL | | 1st | Vcc | Vread | Floating |
| | | 2nd, 3rd, ⋯ | 0V | 0V | Floating |
| GSL | | 1st | 0V | Vread | Floating |
| | | 2nd, 3rd, ⋯ | > Vcc (5V) | 0V | Floating |
| CSL | | 1st | < Vcc (1.5V) | 0V | Floating |
| | | 2nd, 3rd, ⋯ | > Vcc (5V) | 0V | Floating |
| PWELL | | 1st | 0V | 0V | Vers (18V) |
| | | 2nd, 3rd, ⋯ | 0V | 0V | Vers (18V) |

THREE-DIMENSIONAL MEMORY DEVICE AND PROGRAMMING METHOD

CROSS-REFERENCE TO RELATED APPLICATIONS

This U.S. non-provisional patent application claims priority under 35 U.S.C. §119 to Korean Patent Application No. 10-2007-0140503 filed on Dec. 28, 2007, the subject matter of which is hereby incorporated by reference.

BACKGROUND

The present invention relates generally to three-dimensional memory devices and related programming methods.

The development of semiconductor devices, such as semiconductor memory devices, is one characterized by a constant quest for enhanced functionality, better operating speeds, and increased integration density. One approach taken to the fabrication of semiconductor memory devices with increased integration density (e.g., a higher number of memory cells per unit area of a substrate surface) involves the vertical stacking of multiple substrates to form 3-dimensional memory devices. Conventional 3-dimensional memory devices are disclosed, for example, in U.S. Pat. No. 5,835,396 issued on Nov. 10, 1998 and titled "Three-Dimensional Read-Only Memory"; U.S. Pat. No. 6,034,882 issued on Mar. 7, 2000 and titled "Vertically Stacked Field Programmable Nonvolatile Memory and Method of Fabrication"; and U.S. Pat. No. 7,002,825 issued on Feb. 21, 2006 and titled "Word Line Arrangement Having Segmented Word Line". The collective subject matter of these documents is hereby incorporated by reference.

Such 3-dimensional memory devices generally include a memory cell array formed on each one of a plurality of material layers. Each material layer may be formed, for example, by a silicon substrate or a silicon-on-insulator (SOI) structure. One or more of the material layers may include a layer grown using an epitaxial fabrication process.

SUMMARY

Embodiments of the invention provide a 3-dimensional memory device and related programming method capable of reducing memory cell disturbance during a programming operation.

In one embodiment, the invention provides a method of performing a programming operation within a three-dimensional memory device, the three-dimensional memory device comprising a stacked plurality of layers, each layer comprising a memory array, and each memory array comprising a string of memory cells, the method comprising; for each unselected string associated with an unselected layer in the plurality of layers, charging the channel of memory cells associated with unselected string with a shut-off voltage, and thereafter programming a selected string associated with a selected layer in the plurality of layers.

In another embodiment, the invention provides a memory system comprising a memory controller and a three-dimensional memory device; wherein the three-dimensional memory device comprises, a stacked plurality of layers, each layer comprising a memory array having a string of memory cells, wherein programming data to a memory cell of a respective string is controlled by a selection transistor and a ground selection transistor associated with the string, a plurality of shared word lines configured to program data to memory cells in strings associated with each one of the plurality of layers, a shared bit line configured to program data to memory cells in strings associated with each one of the plurality of layers, and the memory controller configured to receive an address defining a selected layer from the plurality of layers containing a memory cell to be programmed and unselected layers, and thereafter charging the channel of memory cells in strings associated with the unselected layers with a shut-off voltage, and thereafter programming a memory cell of a string associated with a selected layer.

BRIEF DESCRIPTION OF THE FIGURES

FIG. 3 is a table showing voltages used in programming, reading, and erasing operations when selecting the first NAND string shown in FIG. 2;

FIG. 7 is a table showing voltages used in programming, reading, and erasing operations when selecting the first NAND string shown in FIG. 6;

DESCRIPTION OF EMBODIMENTS

Figure 1:
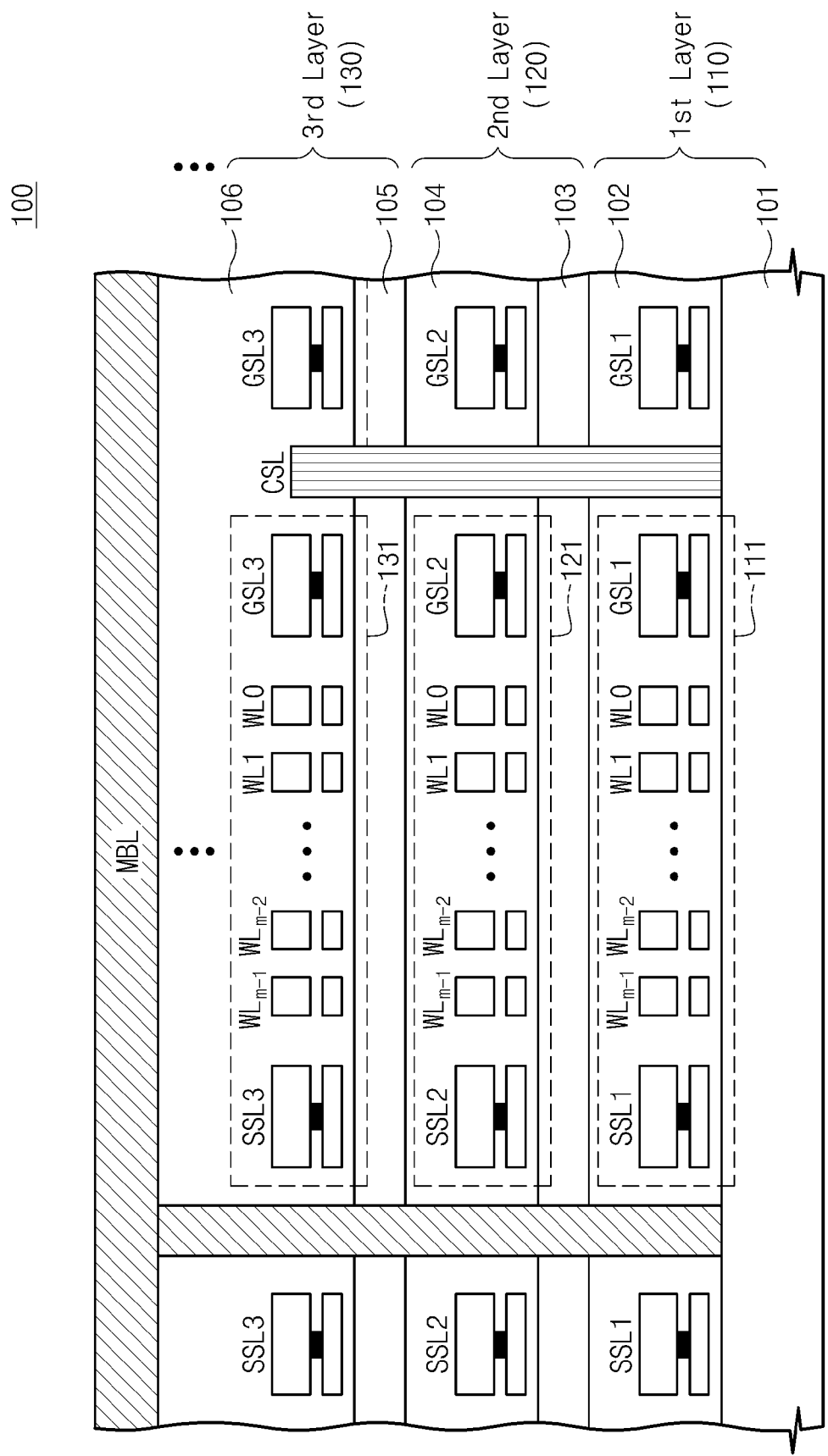
FIG. 1 is a diagram illustrating a section of a 3-dimensional memory device according to an embodiment of the invention.

Embodiments of the invention will now be described with reference to the accompanying drawings. The present invention may, however, be embodied in different forms and should not be constructed as being limited to only the illustrated embodiments. Rather, the embodiments are presented as teaching examples. Throughout the drawings and written description, like reference numerals are used to indicate like or similar elements.

A 3-dimensional memory device according to an embodiment of the invention may be configured to precharge, and then shut off respective strings of nonvolatile memory cells associated with unselected layers during a programming operation. That is, during the programming operation, the strings associated with unselected layers are placed in a conductive state by means of a self-boosting operation providing channel voltages higher than those conventionally applied (i.e., higher than a "normal channel voltage"). This approach reduces the possibility of the so-called "program disturbance" for memory cells coupled to selected word lines of the unselected layers.

FIG. 1 is a diagram illustrating a section of a 3-dimensional memory device 100 according to an embodiment of the invention. Referring to FIG. 1, the 3-dimensional memory device comprises a first memory array 111 formed on a first layer 110, a second memory array 121 formed on a second layer 120, and a third memory array formed in a third layer 130. The first, second, and third memory arrays 111, 121, and 131 associated with the first, second, and third layers 110, 120, and 130 are arranged to share one or more bit lines. While FIG. 1 shows only three stacked memory arrays, it will be understood by those skilled in the art that other embodiments of the invention may incorporate a different number of stacked memory arrays.

In this description, the memory arrays 111 through 131 may be formed by an arrangement of memory cells forming a read-only memory (ROM), a static random access memory (RAM), a silicon-oxide-silicon-nitride-oxide-silicon (SONOS) memory, or other types of memory. For purposes of the explanation that follows, memory arrays are assumed to be NAND flash type memory arrays.

The first memory array 111 is formed on a substrate 101 of silicon or similarly appropriate material. The second and third memory arrays are formed respectively on memory material layers 103 and 105 (e.g., a SOI structure). The memory material layers 103 and 105 are stacked over the substrate 101 in an overlapping or partially overlapping manner. Insulation layers 102, 104, and 106 are respectively interposed between adjacent substrate 101 and memory material layers 103 and 105 to electrically isolate overlapping elements. Insulation layers 102, 104 and/or 106 may be formed from a bulk dielectric such as borosilicate glass (BSG), phosphosilicate glass (PSG), or borophosphosilicate glass (BPSG), for example.

The multiplicity of memory cell strings included in each memory array 111 through 131 are conceptually illustrated in FIG. 1 by a single NAND string, and will be collectively or individually be referred to as first, second, and third NAND strings.

As shown in FIG. 1, the 3-dimensional memory device 100 includes a plurality of NAND strings coupled to a single bit line. As is conventionally understood, each of the respective NAND strings is associated with a string selection line, SSL1, SSL2, SSL3, and ground selection lines GSL1, GSL2, GSL3. Additionally, the plurality of NAND strings share a common source line CSL. In the 3-dimensional memory device 100 illustrated in FIG. 1, a predetermined voltage is applied to unselected NAND strings (i.e., NAND strings not indicated by a received address associated with the programming operation) during a programming operation. That is, these unselected NAND strings are precharged to a predetermined voltage (hereafter referred to as an "elevated channel voltage") during the programming operation. This level of precharge essentially shuts off the unselected NAND strings. Thus, memory cells coupled to a selected word line but also associated with an unselected NAND string are prevented from being inadvertently programmed (i.e., disturbed) by the ongoing programming operation.

Thus, in the 3-dimensional memory device 100 of FIG. 1, unselected NAND strings are shut off after being charged to the elevated channel voltage during the programming operation. By charging unselected NAND strings to the elevated charge voltage, channel voltages for memory cells in the unselected NAND strings become higher than normal channel voltages at the beginning of a self-boosting operation. As a result, the possibility of program disturbance is reduced by the increase channel voltages of the unselected NAND strings.

Figure 2:
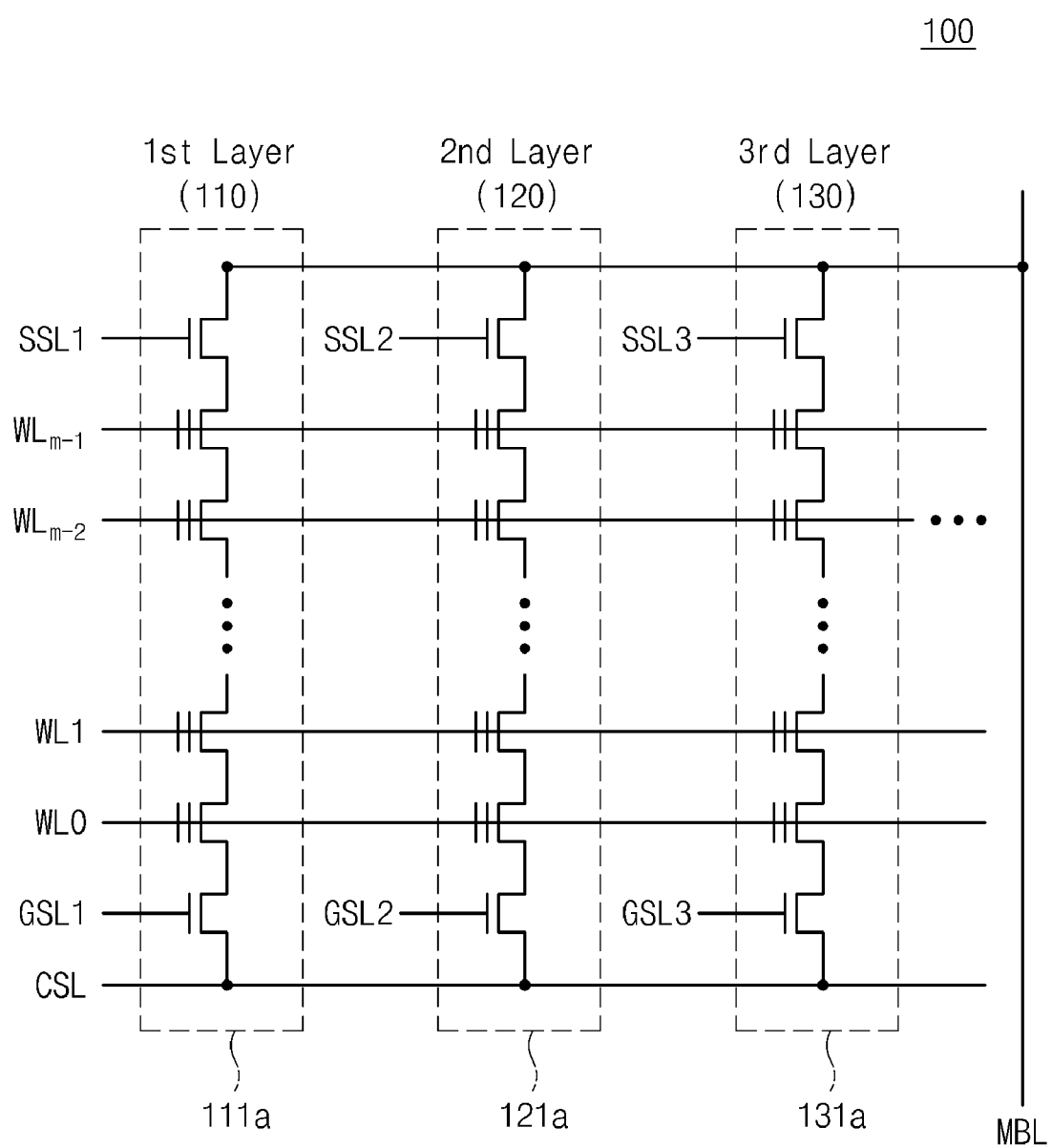
FIG. 2 is a circuit diagram illustrating a NAND string structure of the 3-dimensional memory device shown in FIG. 1.

FIG. 2 is a circuit diagram further illustrating a NAND string structure for a 3-dimensional memory device according to an embodiment of the invention, such as the one shown in FIG. 1. Referring to FIG. 2, the 3-dimensional memory device 100 includes a plurality of NAND strings 111a, 121a, 131a commonly associated with word lines WL0 through WLm-1, a main bit line MBL, and common source line CSL. The plurality of NAND strings, 111a, 121a, 131a and also conventionally associated with respective string selection lines SSL1, SSL2, SSL3 and ground selection lines GSL1, GSL2, GSL3.

FIG. 3 is a table showing exemplary voltages used during programming, read, and erase operations for selecting first NAND string 111a shown in FIG. 2. Referring to FIGS. 2 and 3, the voltages applied to the NAND strings of the 3-dimensional memory device 100 are arranged as follows.

During the programming operation, a program voltage Vpgm is applied to a selected word line while a pass voltage Vpass is applied to unselected word lines. 0V or 0.5V is applied to a selected bit line while a power source voltage Vcc (e.g., 2.2V) is applied to unselected bit lines. The power source voltage Vcc is also applied to the string selection line SSL1 of the first NAND string 111a while 0V is applied to the string selection lines SSL2 and SSL3 for the remaining (unselected) NAND strings 121a and 131a. Additionally, 0V is applied to the ground selection line GSL1 of the first NAND string 111a while a voltage higher than the power source voltage Vcc is applied to the ground selection lines GSL2 and GSL3 of unselected NAND strings 121a and 131a. A voltage (e.g. 5V) higher than the power source voltage Vcc is applied to the common source line CSL and 0V is applied to the semiconductor well regions (hereafter, "wells") in which the NAND strings 111a, 121a, and 131a are respectively formed.

In the 3-dimensional memory device 100 of FIGS. 1-3, by applying the same voltage—i.e., the elevated channel voltage which is higher than the power source voltage Vcc—to the ground selection lines GSL2 and GSL3 of the unselected NAND strings 121a and 131a, and the common source line CSL, the channels of the unselected NAND strings 121a and are effectively shut off from the common source line CSL. Here, channel voltages of the unselected NAND strings 121a and 131a are leveled by subtracting threshold voltages from the elevated channel voltage which is higher than the power source voltage Vcc. In this manner, the channels of the memory cells associated with the unselected NAND strings 121a and 131a are prohibited from being programmed during the ongoing programming operation by the self-boosting effect even though the program voltage Vpgm is applied to the selected word line during the programming operation. This result will be further described in some additional detail with reference to FIG. 4.

During a read operation, a read voltage Vr is applied to a selected word line while a read pass voltage Vread is applied to unselected word lines. A charge voltage Vpc (e.g., 1.0V) is applied to a selected bit line while 0V is applied to unselected bit lines. The read pass voltage Vread is also applied to the string and ground selection lines SSL1 and GSL1 of the selected NAND string 111a, while 0V is applied to the string and ground selection lines of the unselected NAND strings 121a and 131a. 0V is also applied to the common source line CSL and the wells in which the NAND strings 111a, 121a and 131a are formed.

During the erase operation, an erase voltage Ve (e.g., 0.3V) is applied to a selected word line and a well erasing voltage Vers (e.g., 18V) is applied to the wells of the NAND strings 111a, 121a and 131a. At this time, the unselected word lines, unselected bit lines, the string and ground selection lines (e.g., SSL1, SSL2, and SSL3, and GSL1, GSL2, and GSL3) are allowed to float.

Figure 4:
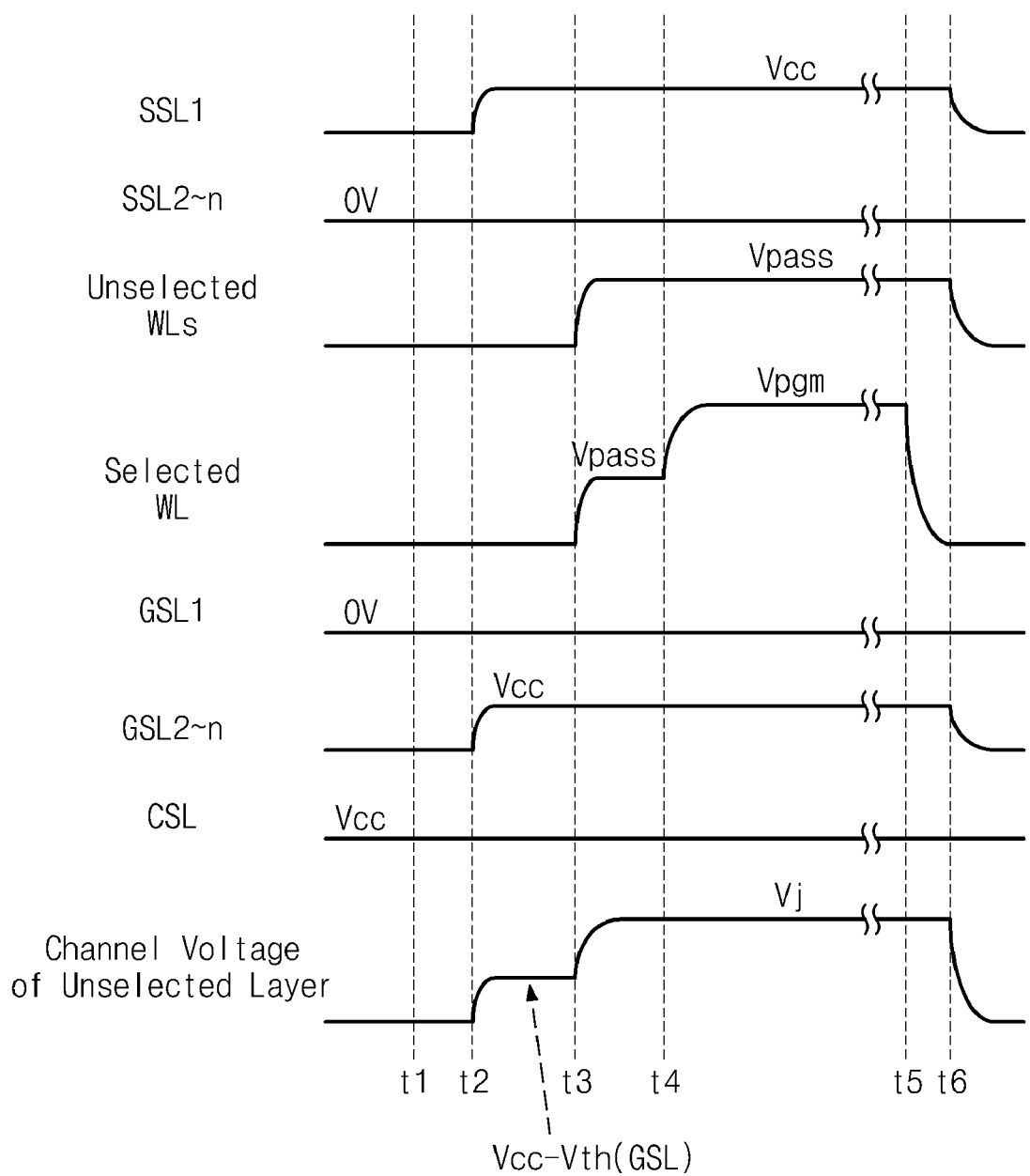
FIG. 4 is a timing diagram related to the programming operation for the 3-dimensional memory device shown in FIG. 1.

FIG. 4 is a timing diagram related to the programming operation for the 3-dimensional memory device 100 described in relation to FIGS. 1-3. Referring to FIG. 4, the programming operation for the 3-dimensional memory device is carried out as follows. For convenience of description, it is assumed that memory cells in first memory array 111 of the first layer 110 are selected for programming.

In a first time period (t1 to t2), certain conventionally understood preparatory functions are accomplished (e.g., page buffers are set up, a high voltage generator is activated to generate required voltage(s), program data is loaded to the page buffers, etc.). Further, the power source voltage Vcc is applied to the common source line CSL, and the common source line CSL is maintained at the level of the power source voltage Vcc until the programming operation is complete at time t6.

During a second time period (t2 to t3), corresponding voltages are applied to the selected first layer 110 and unselected layers 120 and 130. That is, the power source voltage Vcc is applied to the string selection line SSL1 of the first layer 110 while 0V is applied to the ground selection line GSL1 of the first layer 110. 0V is applied to the other string selection lines SSL2 and SSL3 of the unselected layers 120 and 130, while the power source voltage Vcc is applied to the ground selection lines GSL2 and GSL3 of the unselected layers 120 and 130. Here, the string and ground selection lines, SSL1, SSL2, SSL3 and GSL1, GSL2, GSL3 are maintained on the voltages applied thereto until the programming operation is complete at time t6. Over this interval, the channels of memory cells associated with the unselected layers are shut off by the application of a "shut-off voltage" to the ground selection lines GSL2 and GSL3. In the illustrated embodiment, the shut-off voltage is the power source voltage Vcc minus a threshold voltage Vth for a corresponding ground selection transistor. In other words, the respective channels of memory cells associated with the unselected layers 120 and 130 are charged with the shut-off voltage (Vcc-Vth).

Further, during the second time period (t2~t3), corresponding bit lines (not shown) are set up. That is, 0V is applied to a bit line connected to a memory cell to be programmed, while the power source voltage Vcc is applied to a bit line connected to a memory cell not to be programmed (i.e., memory cells that are program-inhibited). Generally, a bit line connected to a memory cell to be programmed is called 'selected bit line' or 'selected BL' while a bit line connected to a memory cell to be program-inhibited is called 'deselected bit line' or 'deselected BL'.

In a third time period (t3 to t4), the pass voltage is applied to all of the word lines including selected and unselected word lines. During this period and beyond, the pass voltage Vpass applied to the unselected word lines is maintained level until the programming operation is complete at time t6. However, the pass voltage initially applied to the unselected layers is elevated according to a conventionally understood self-boosting effect. The boosting of the voltage applied to the unselected word lines results in the elevated channel voltage Vj being apparent on the channels of memory cells associated with the unselected layers.

During a fourth time period (t4 to t5), the program voltage Vpgm is applied to the selected word lines. Thereby, memory cells coupled to the selected word line of the selected layer 110 are all programmed. During this period, channels of the unselected layers 120 and 130 are conditioned by the elevated channel voltage. Accordingly, the programmed condition of the memory cells are prevented from being disturbed despite being coupled to the selected word line associated with the unselected layers 120 and 130.

During a fifth time period (t5 to t6), a first program recovery operation performed to discharge the program voltage Vpgm previously applied to the selected word line.

At the completion of the programming operation at time t6, a second program recovery operations associated with the pass voltage Vpass and the bit lines is performed. Thereafter, a verify-read operation may be performed to determine whether the programming operation has been successfully completed. Following the verify-read operation, the programming operation is terminated.

Thus, in the 3-dimensional memory device 100 according to an embodiment of the invention, the channels of memory cells disposed in deselected layers are shut off by application of a shut-off voltage (Vcc-Vth). By shutting off these memory cells, the possibility of program disturbances is markedly reduced.

Figure 5:
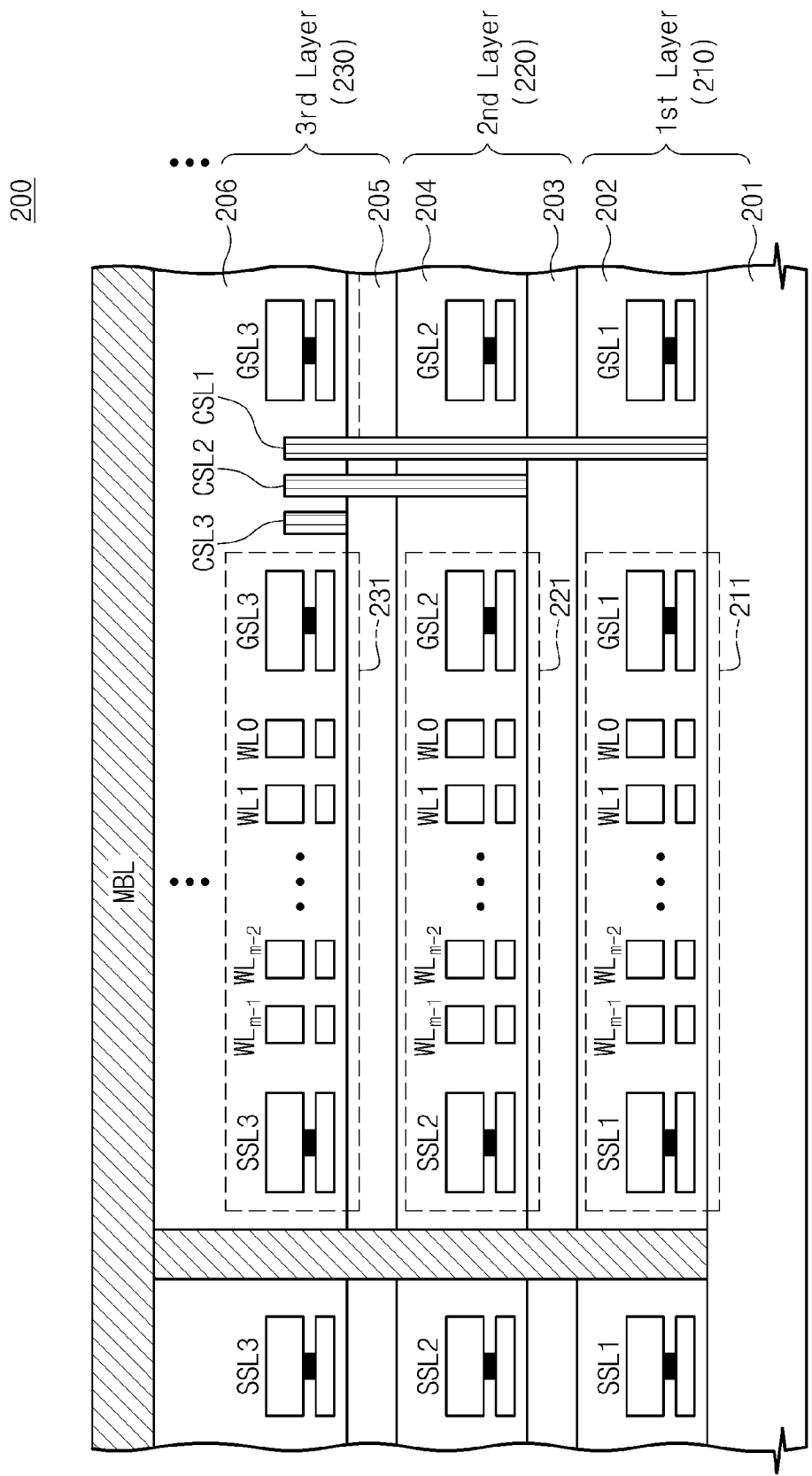
FIG. 5 is a diagram illustrating a section of a 3-dimensional memory device according to another embodiment of the invention.

FIG. 5 is a diagram illustrating a section of a 3-dimensional memory device 200 according to another embodiment of the invention. Comparing the 3-dimensional memory device 200 with the 3-dimensional memory device 100 shown in FIG. 1, in the 3-dimensional memory device 200 shown in FIG. 5, a plurality of material layer specific common source lines CSL1, CSL2, and CSL3 are divisionally arranged in relation to one of the plurality of material layers in the vertically stacked material layers 210, 220, and 230. The other structural elements apparent in the 3-dimensional memory device 200 are substantially similar to those previously described in relation to the 3-dimensional memory device 100 shown in FIG. 1 and will not be discussed in any further detail in relation to this embodiment.

Figure 6:
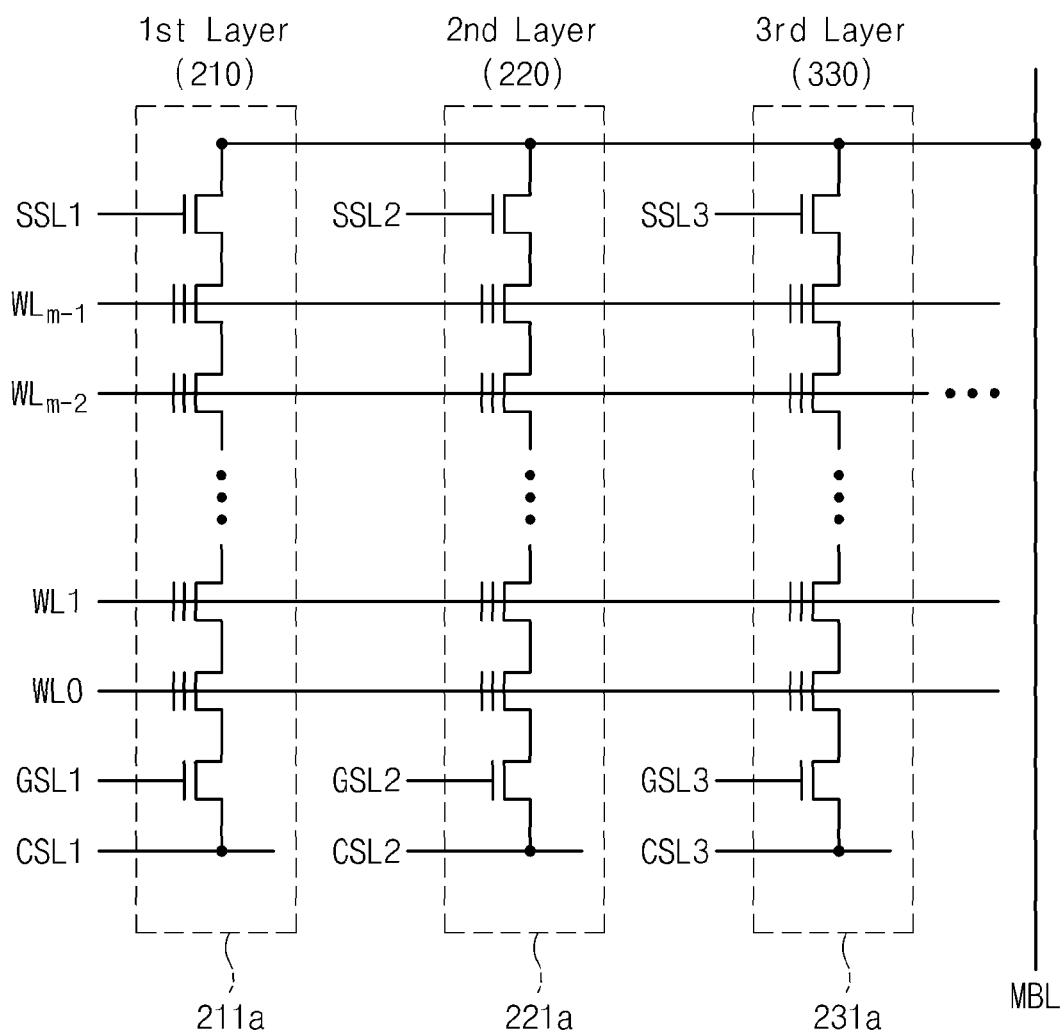
FIG. 6 is a circuit diagram illustrating a NAND string structure of the 3-dimensional memory device shown in FIG. 5.

FIG. 6 is a circuit diagram illustrating a NAND string structures for the 3-dimensional memory device 200 shown in FIG. 5. Referring to FIG. 6, the 3-dimensional memory device comprises a grouped plurality of NAND strings 211a, 221a, and 231a. The NAND strings, 211a, 221a, and 231a share word lines WL0 through WLm-1 and a main bit line MBL. The NAND strings, 211a, 221a, and 231a include the string selection lines SSL1, SSL2, SSL3, and the ground selection lines GSL1, GSL2, GSL3.

FIG. 7 is a table showing voltages used during programming, read, and erase operations when selecting the first NAND string 211a shown in FIG. 6. Referring to FIGS. 6 and 7, the voltages applied to the NAND strings of the 3-dimensional memory device 200 are arranged as follows.

During a programming operation, a program voltage Vpgm is applied to a selected word line while a pass voltage Vpass is applied to unselected word lines. 0V or 0.5V is applied to a selected bit line while a power source voltage Vcc (e.g., 2.2V) is applied to unselected bit lines. The power source voltage Vcc is also applied to the string selection line SSL1 of the first NAND string 211a while 0V is applied to the string selection lines SSL2 and SSL3 of the unselected NAND strings 221a and 231a. Additionally, 0V is applied to the ground selection line GSL1 of the first NAND string 211a while a voltage (e.g., 5V) higher than the power source voltage Vcc is applied to the ground selection lines GSL2 and GSL3 of the unselected NAND strings 221a and 231a. A voltage (e.g., 1.5V) lower than the power source voltage Vcc is applied to selected common source line CSL1 associated with selected NAND string 211a, while a voltage (e.g., 5V) higher than the power source voltage Vcc is applied to unselected common source lines CSL2 and CSL3 associated respectively with unselected NAND strings 221a and 231a. 0V is applied to wells in which the NAND strings 211a, 221a, and 231a.

In the 3-dimensional memory device 200, by applying the same voltage, which is higher than the power source voltage Vcc, to the ground selection lines GSL2 and GSL3 of the unselected NAND strings 221a and 231a, and the unselected common source lines CSL2 and CSL3, the channels of memory cells associated with unselected NAND strings 221a and 231a are shut off from the unselected common source lines CSL2 and CSL3. Here, the channel voltages for memory cells associated with the unselected NAND strings 221a and 231a are charged to a voltage that is lowered by a threshold voltage (Vth) by a ground selection transistor from a voltage that is higher than the power source voltage Vcc. Thereby, the channels of the memory cells associated with unselected NAND strings 221a and 231a are prohibited from being programmed during the programming operation by the self-boosting effect even though the program voltage Vpgm is applied to the selected word line.

Thus, comparing the 3-dimensional memory device of FIGS. 1 and 5, the 3-dimensional memory device 200, wherein a single common source line is replaced by a plurality of material layer specific common source lines CSL1, CSL2 and CSL3 are divisionally arranged in relation to layers 210, 220 and 230 respectively. This arrangement is helpful in enhancing the self-boosting effect during the programming operation because it is able to elevate the channel voltages of the memory cells associated with unselected strings at the time of shut-off. At the shut-off time, the self-boosting effect increases as high as the channel voltages of the unselected strings, which will be described in some additional detail with respect to FIG. 8.

During a read operation, a read voltage Vr is applied to a selected word line while a read pass voltage Vread is applied to unselected word lines. A charge Vpc is applied to a selected bit line while 0V is applied to unselected bit lines. The read pass voltage Vread is also applied to the string and ground selection lines SSL1 and GSL1 of the selected NAND string 211a, while 0V is applied to the string and ground selection lines, SSL2 and SSL3 and GSL2 and GSL2 of unselected NAND strings 221a and 231a. 0V is applied to the common source lines CSL1 through CSL3 and the wells of the NAND strings 211a, 221a and 231a.

During the erase operation, an erase voltage Ve (e.g., 0.3V) is applied to a selected word line and a well erasing voltage Vers (e.g., 18V) is applied to the wells of the NAND strings 211a, 221a and 231a. Other lines, i.e., unselected word lines, unselected bit lines, the string and ground selection lines SSL1, SSL2, SSL3, and GSL1, GSL2, GSL3 are allowed to float.

Figure 8:
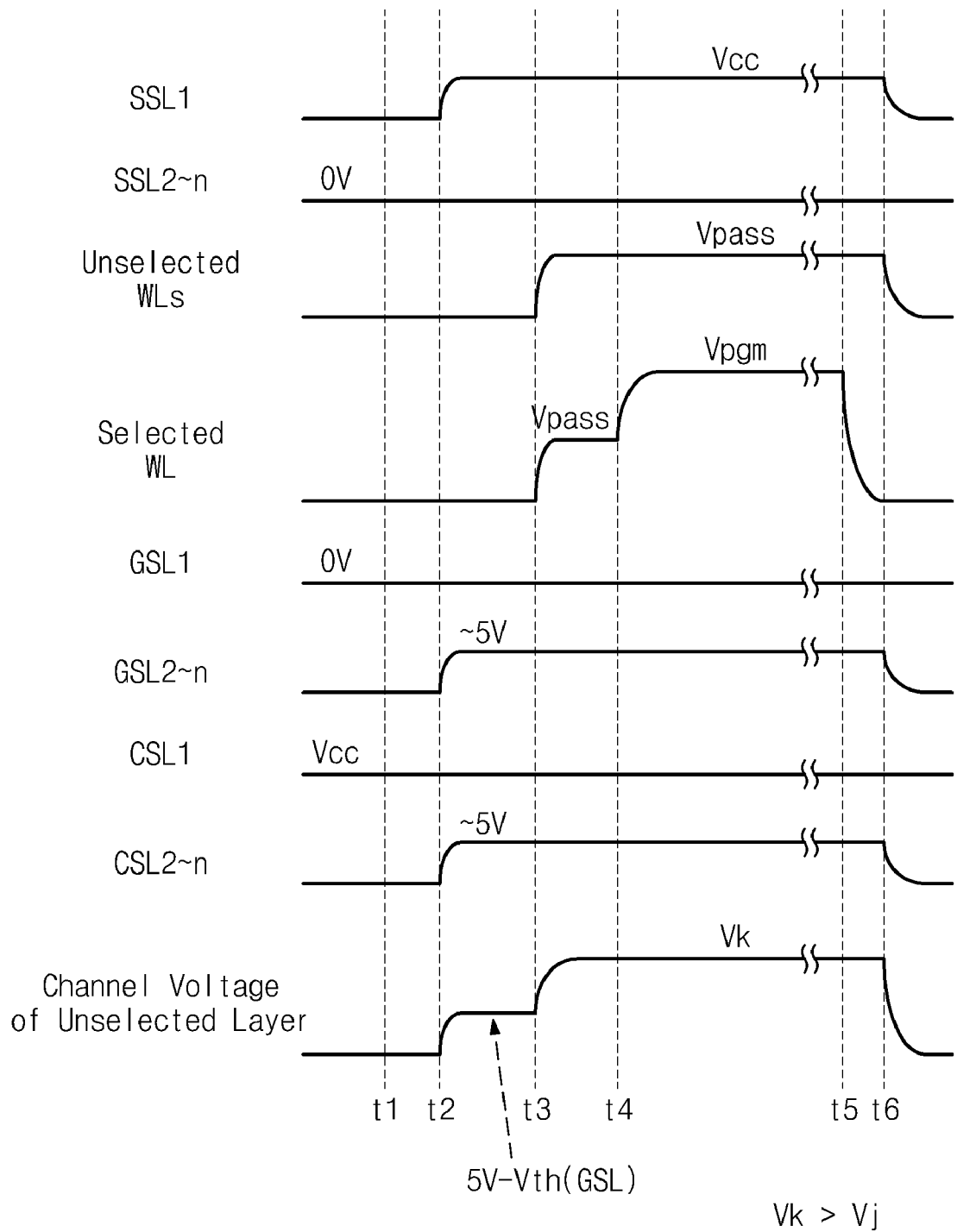
FIG. 8 is a timing diagram related to programming operation for the 3-dimensional memory device shown in FIG. 5.

FIG. 8 is a timing diagram for a programming operation of the 3-dimensional memory device 200 shown in FIG. 5. Referring to FIGS. 5 through 8, the programming operation of the 3-dimensional memory device 200 is carried out as follows. For convenience of description, it will be assumed that the first layer 210 is selected in programming.

During a first time period (t1 to t2), various preparatory functions are carried out including (e.g.,) setting up page buffers, activating a high voltage generator, loading data to be programmed, etc. The power source voltage Vcc is applied to the common source line CSL1 of the first layer 210. The selected common source line CSL1 associated with first later 210 is maintained at the level of the power source voltage Vcc throughout the programming operation. On the other hand, unselected common source lines CSL2 and CSL3 associated with the unselected layers 220 and 230 are initially supplied with ground voltage 0V.

During a second time period (t2 to t3), voltages are correspondingly supplied to select the first layer 210 from unselected layers 220 and 230. That is, the power source voltage Vcc is applied to a selected string selection line SSL1 associated with the first layer 210, while 0V is applied to the selected ground selection line GSL1 associated with of the first layer 210. 0V is applied to unselected string selection lines SSL2 and SSL3 associated with unselected layers 220 and 230, while an elevated voltage (e.g., 5V) higher than the power source voltage Vcc is applied to the unselected ground selection lines GSL2 and GSL3 associated with the unselected layers 220 and 230. Thus, the power source voltage Vcc is applied to the selected common source line CSL1 associated with the first layer 210, while the elevated voltage (e.g., 5V) higher than the power source voltage Vcc is applied to the unselected layers 220 and 230. Here, the string and ground selection lines SSL1, SSL2, and SSL3, and GSL1, GSL2, and GSL3, as well as the unselected common source lines CSL2 and CSL3 are maintained at the respective voltages levels throughout the remainder of the programming operation completed at time t6.

Under these conditions, the channels of memory cells associated with the unselected layers are shut off by the application of the elevated voltage (e.g., 5V) to the ground selection lines GSL2 and GSL3 associated with the unselected common source lines CSL2 and CSL3. Thus, voltages apparent at the shut-off memory cell channels during the second time period is (5V-Vth), where Vth is the threshold voltage of a ground selection transistor. That is, the shut-off memory cell channels for the unselected layers 220 and 230 are charged to a shut-off voltage of (5V-Vth).

Further during the second time period (t2 to t3), corresponding bit lines are set up. For instance, 0V is applied to a selected bit line connected to a memory cell to be programmed, while the power source voltage Vcc is applied to unselected bit lines connected to memory cell not to be programmed (i.e., to be program-inhibited).

During a third time period (t3 to t4), the pass voltage is applied to all of the word lines including selected and unselected word lines. During this period, the pass voltage Vpass applied to the unselected word lines is held on its level until the programming operation is complete. During this, voltages are increased in the channels of the unselected layers by the self-boosting effect. Here, the increased channel voltage (i.e., an elevated channel voltage) is referred to in FIG. 6 as Vk. When the program voltage Vpgm is being applied thereto, the elevated channel voltage Vk may be higher than the elevated channel voltage Vj previously identified with the embodiment of FIG. 4. As a result, during the programming operation, the 3-dimensional memory device 200 shown in FIG. 5 is more effective in reducing program disturbance than the 3-dimensional memory device 100 shown in FIG. 1.

During a fourth time (t4 to t5), the program voltage Vpgm is applied to a selected word line. Thereby, memory cells coupled to the selected word line of the selected layer 210 are all programmed. During this period, channels for memory cells associated with the unselected layers 220 and 230 are conditioned by the elevated channel voltage. Through this mechanism, the programming condition of the memory cells is less likely to be disturbed despite being coupled to the selected word line.

During a fifth time period (t5 to t6), a first program recovery operation is performed to discharge the program voltage Vpgm previously applied to the selected word line.

At time t6 following the completion of the programming operation, a second recovery operation directed to the pass voltage Vpass and the bit lines is performed. Afterwards, a verify-reading operation may be conducted to determine whether the programming operation has been successfully completed.

In the 3-dimensional memory device 200 according to an embodiment of the invention, the channels of memory cells associated with deselected layers are shut off by conditioning with an elevated channel voltage (e.g., V>Vcc−Vth).

Figure 9:
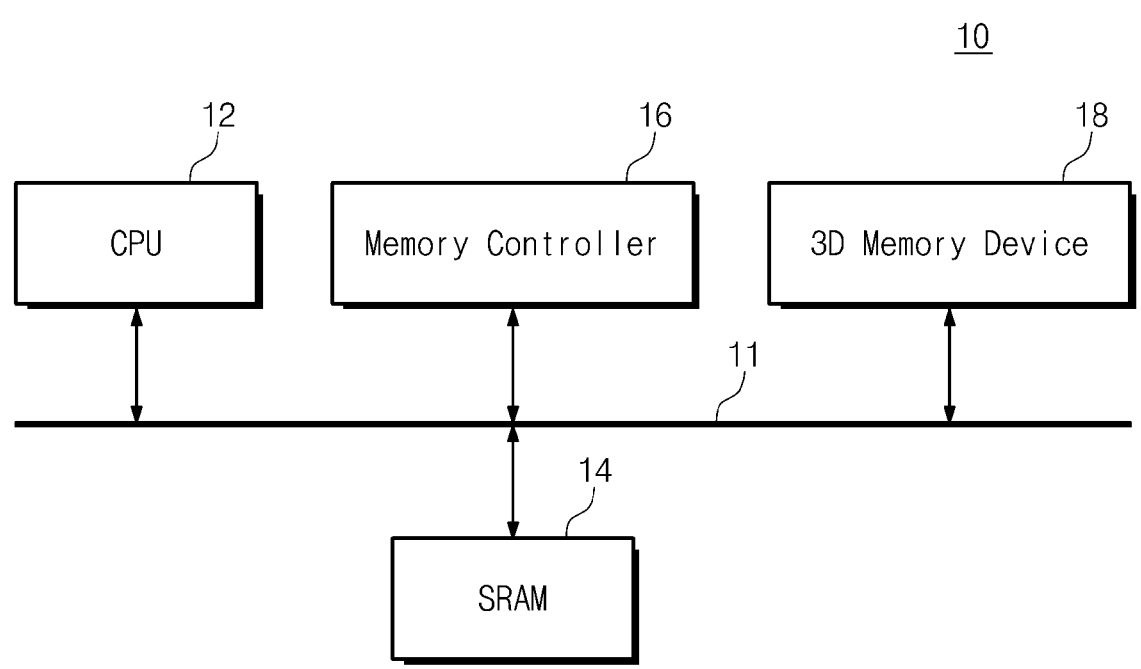
FIG. 9 is a block diagram of a memory system incorporating with a 3-dimensional memory device according to an embodiment of the invention.

FIG. 9 is a block diagram of a memory system 10 incorporating a 3-dimensional memory device according to an embodiment of the invention. Referring to FIG. 9, the memory system 10 according to the present invention is organized by a central processing unit (CPU) 12, a static RAM (SRAM) 14, a memory controller 16, and a 3-dimensional memory device 18, all of which are electrically connected to a bus 11. The 3-dimensional memory device 18 may be configured substantially as same as that shown in FIG. 1 or 5. In the 3-dimensional memory device 18, N-bit data (N is a positive integer) processed or to be processed by the CPU 12 may be stored through the memory controller 16.

Although not shown in FIG. 9, the computing system may be further equipped with an application chipset, a camera image processor (e.g., complementary metal-oxide-semiconductor (CMOS) image sensor; (i.e., CIS), a mobile DRAM, etc. The memory controller 16 and the 3-dimensional memory device 18 may be even embedded in a solid state drive or disk (SSD).

The 3-dimensional memory device 18 and/or the memory controller 16 can be mounted on the memory system 10 by means of various types of packages. For instance, the 3-dimensional memory device 18 and/or the memory controller 16 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents.

What is claimed is:

1. A method of performing a programming operation within a three-dimensional memory device, the three-dimensional memory device comprising a stacked plurality of layers, each layer comprising a memory array, and each memory array comprising a string of memory cells, the method comprising:
   for each unselected string associated with an unselected layer in the plurality of layers, charging a channel of memory cells associated with the unselected strings with a shut-off voltage; and thereafter,
   programming a selected string associated with a selected layer of the plurality of layers,
   wherein the channels of the memory cells of the unselected strings are charged by ground selection transistors, and the shut-off voltage is equal to a voltage greater than or equal to a power supply voltage less a threshold voltage of the ground selection transistors disposed in the unselected layers, and
   respective strings associated with each one of the plurality of layers are commonly connected to a shared bit line.

2. The method of claim 1, wherein respective strings associated with each one of the plurality of layers are commonly connected to a single common source line.

3. The method of claim 2, wherein the programming operation further comprises applying the power supply voltage to the common source line.

4. The method of claim 3, wherein the programming operation further comprises:
   applying the power source voltage to a selected string selection line associated with the selected layer, and applying a ground voltage to a selected ground selection line associated with the selected layer, and
   applying the ground voltage to unselected string selection lines associated with unselected layers, and applying the power supply voltage to unselected ground selection lines associated with the unselected layers.

5. The method of claim 4, further comprising:
   after charging the channel of memory cells associated with unselected strings, initially applying a pass voltage to a selected word line associated with a memory cell to be programmed and to unselected word lines not associated with the memory cell to be programmed; and thereafter, increasing the pass voltage applied to the selected word line.

6. The method of claim 5, wherein the pass voltage applied to the selected word line is increased by a programming voltage.

7. The method of claim 5, wherein initially applying the pass voltage to the selected and unselected word lines generates an elevated channel voltage for channels of memory cells associated with unselected strings.

8. A method of performing a programming operation within a three-dimensional memory device, the three-dimensional memory device comprising a stacked plurality of layers, each layer comprising a memory array, and each memory array comprising a string of memory cells, the method comprising:
   for each unselected string associated with an unselected layer in the plurality of layers, charging a channel of memory cells associated with the unselected strings with a shut-off voltage; and thereafter,
   programming a selected string associated with a selected layer of the plurality of layers,
   wherein respective strings associated with each one of the plurality of layers are respectively connected to one of a plurality of layer specific common source lines, and
   wherein the programming operation comprises
   applying a power supply voltage to a selected common source line in the plurality of common source lines associated with the selected layer, and
   applying an elevated voltage higher than the power supply voltage to unselected common source lines in the plurality of common source lines associated with the unselected layers.

9. The method of claim 8, wherein the programming operation further comprises:
   applying the power source voltage to a selected string selection line associated with the selected layer, and applying a ground voltage to a selected ground selection line associated with the selected layer, and
   applying the ground voltage to unselected string selection lines associated with unselected layers, and applying the elevated voltage to unselected ground selection lines associated with the unselected layers.

10. The method of claim 9, further comprising:
    after charging the channel of memory cells associated with unselected strings, initially applying a pass voltage to a selected word line associated with a memory cell to be programmed and to unselected word lines not associated with the memory cell to be programmed and thereafter, increasing the pass voltage applied to the selected word line.

11. The method of claim 10, wherein the pass voltage applied to the selected word line is increased by a programming voltage.

12. The method of claim 11, wherein initially applying the pass voltage to the selected and unselected word lines generates an elevated channel voltage for channels of memory cells associated with unselected strings.

13. A memory system including a memory controller and a three-dimensional memory device, wherein the three-dimensional memory device comprises:
- a stacked plurality of layers, each layer comprising a memory array having a string of memory cells, wherein programming data to a memory cell of a respective string is controlled by a selection transistor and a ground selection transistor associated with the string;
- a plurality of shared word lines configured to program data to memory cells in strings associated with each one of the plurality of layers; and
- a shared bit line configured to program data to memory cells in strings associated with each one of the plurality of layers,
- wherein the memory controller is configured to receive an address defining a selected layer from the plurality of layers containing a memory cell to be programmed and unselected layers, thereafter charge a channel of memory cells in strings associated with the unselected layers with a shut-off voltage, and thereafter program a memory cell of a string associated with the selected layer, and
- wherein the channels of the memory cells in strings associated with the unselected layers are charged by the ground selection transistors under control of the memory controller, and the shut-off voltage is equal to a voltage greater than or equal to a power supply voltage less a threshold voltage of the ground selection transistors disposed in the unselected layers, and
- respective strings associated with each one of the plurality of layers are commonly connected to a shared bit line.

14. The memory system of claim 13, further comprising:
- a single common source line commonly connected to strings in each one of the plurality of layers and configured to program data to the memory cells of the string associated with the selected layer.

15. The memory system of claim 13, further comprising:
- a plurality of common source lines respectively connected to a strings associated with respective ones of the plurality of layers, and configured to program data to the memory cells of a string when one of the plurality of layers is the selected layer.

* * * * *